US009864249B2

(12) United States Patent
Xu et al.

(10) Patent No.: US 9,864,249 B2
(45) Date of Patent: Jan. 9, 2018

(54) ELECTROCHROMISM DISPLAY DEVICE AND METHOD FOR FABRICATING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shaoying Xu, Beijing (CN); Xuecheng Hou, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 43 days.

(21) Appl. No.: 14/500,232

(22) Filed: Sep. 29, 2014

(65) Prior Publication Data

US 2015/0268530 A1  Sep. 24, 2015

(30) Foreign Application Priority Data

Mar. 21, 2014 (CN) .......................... 2014 1 0108852

(51) Int. Cl.
*H01L 27/12* (2006.01)
*G02F 1/155* (2006.01)
*G02F 1/163* (2006.01)

(52) U.S. Cl.
CPC ............ *G02F 1/155* (2013.01); *H01L 27/124* (2013.01); *H01L 27/1259* (2013.01); *G02F 2001/1635* (2013.01)

(58) Field of Classification Search
CPC ......... H01L 2924/0002; H01L 2924/00; H01L 51/0037; H01L 23/49562; H01L 2924/09701; H01L 27/3276; H01L 29/7869; H01L 2251/5338; H01L 51/0097; H01L 27/1225
See application file for complete search history.

(56) References Cited

U.S. PATENT DOCUMENTS

| 2011/0199666 | A1* | 8/2011 | Chun | G02F 1/161 |
| | | | | 359/269 |
| 2011/0220906 | A1* | 9/2011 | Huang | H01L 27/1225 |
| | | | | 257/72 |
| 2011/0228376 | A1* | 9/2011 | Chung | G02F 1/15 |
| | | | | 359/273 |

* cited by examiner

*Primary Examiner* — Tony Tran
(74) *Attorney, Agent, or Firm* — Nath, Goldberg & Meyer; Joshua B. Goldberg; Annie J. Kock

(57) ABSTRACT

The invention disclose an electrochomism display device and a method of fabricating the same, relates to the field of display technology, and the electrochomism display device may effectively suppress the light-leakage phenomenon in the opening region between adjacent electrochomism pixels, thus the display effect of the electrochomism display device is improved. The electrochomism display device comprises a plurality of eletrochromism pixels, each of the eletrochromism pixels comprises a first conductive layer, an eletrochromism layer, and a second conductive layer sequentially formed on a transparent substrate, an opening region is provided between every two adjacent eletrochromism pixels, wherein a thin film transistor is provided in the opening region, and a gate, a source and a drain of the thin film transistor are made of opaque material.

2 Claims, 6 Drawing Sheets

ELECTROCHROMISM DISPLAY DEVICE AND METHOD FOR FABRICATING THE SAME

FIELD OF THE INVENTION

The invention relates to the field of display technology, in particular, to an electrochromism display device and method of fabricating the same.

BACKGROUND OF THE INVENTION

Electrochomism (EC) refers to a phenomenon of stable and reversible changes occurred in optical attributes of some materials, such as reflectivity, transmissivity, absorptivity, under an applied electrical field, which is expressed as reversible changes in color and transparency in appearance performance. Materials with electrochomism performance are referred to as electrochomism materials, and a display device fabricated using the electrochomism material is referred to as an electrochomism display device. The electrochomism display device has a wide application prospect, since the change in color of the electrochomism material is stable and durable, and energy is needed only when the color is changed.

However, the inventor finds the following problems in the prior art: taking the existing electrochomism display device shown in FIGS. 1 and 2 as an example, an electrochromism display device in the prior art comprises a plurality of electrochomism pixels, such as a first electrochomism pixel 2a and a second electrochomism pixel 2b, each electrochomism pixel comprises a first conductive layer, an electrochomism layer, and a second conductive layer (for example, the first conductive layer 21a, the electrochomism layer 22a and the second conductive layer 23a of the first electrochomism pixel 2a) sequentially formed on a transparent substrate 1, an opening region 10 is provided between every two adjacent electrochomism pixels, it should be noted that the opening region refers to that there is no other layer structure except the transparent substrate between two adjacent electrochomism pixels, and when the sizes of layers in the electrochomism pixels are changed, corresponding changes will be occurred in the opening region, as shown in FIG. 1 and FIG. 2).

It is found through further investigation, since there is no other layer structure except the transparent substrate in the opening region, light-leakage will occur in the opening region. In display of the electrochomism display device, if the light-leakage can not be suppressed, the display effect of the electrochomism display device will be degraded.

SUMMARY OF THE INVENTION

An object of the invention is to provide an electrochomism display device and a method of fabricating the same, which can effectively suppress the light-leakage from the opening region between two adjacent electrochromism pixels, thus the display effect of the electrochomism display device can be improved.

To solve above problems, an electrochomism display device according to the invention adopts following solutions:

An eletrochromism display device comprises a plurality of eletrochromism pixels, each of the eletrochromism pixels comprises a first conductive layer, an eletrochromism layer, and a second conductive layer sequentially formed on a transparent substrate, an opening region is provided between every two adjacent eletrochromism pixels, wherein a thin film transistor is provided in the opening region, and a gate, a source and a drain of the thin film transistor are made of opaque material.

Furthermore, a data electrode made of opaque material is provided in the opening region, and projections of the gate, the drain and the source of the thin film transistor and the data electrode on the transparent substrate at least cover the opening region.

Furthermore, the opaque material is metal.

Furthermore, the thin film transistor is a top-gate thin film transistor, the drain of the thin film transistor is connected with a first conductive layer of a first eletrochromism pixel on one side of the opening region, the projection of the drain of the thin film transistor on the transparent substrate overlaps with a projection of the eletrochromism layer of the first eletrochromism pixel on the transparent substrate; and the data electrode is connected with a second conductive layer of a second eletrochromism pixel on the other side of the opening region.

Furthermore, the thin film transistor is a top-gate thin film transistor, the drain of the thin film transistor is connected with a first conductive layer of a first eletrochromism pixel on one side of the opening region, the projection of the drain of the thin film transistor on the transparent substrate does not overlap with a projection of the eletrochromism layer of the first eletrochromism pixel on the transparent substrate;

a first shielding electrode is provided in the opening region, a projection of the first shielding electrode on the transparent substrate covers a gap between the projection of the eletrochromism layer of the first eletrochromism pixel and the projection of the drain of the thin film transistor; and the data electrode is connected with a second conductive layer of a second eletrochromism pixel on the other side of the opening region.

Furthermore, the thin film transistor is a bottom-gate thin film transistor, the drain of the thin film transistor is connected with a second conductive layer of a first eletrochromism pixel on one side of the opening region; and the data electrode is connected with a first conductive layer of a second eletrochromism pixel on the other side of the opening region, the projection of the data electrode on the transparent substrate overlaps with a projection of the eletrochromism layer of the second eletrochromism pixel on the transparent substrate.

Furthermore, the thin film transistor is a bottom-gate thin film transistor, the drain of the thin film transistor is connected with a second conductive layer of a first eletrochromism pixel on one side of the opening region;

the data electrode is connected with a first conductive layer of a second eletrochromism pixel on one side of the opening region, a projection of the data electrode on the transparent substrate does not overlaps with a projection of the eletrochromism layer of the second eletrochromism pixel on the transparent substrate; and a second conductive layer of the second eletrochromism pixel is connected with a second shielding electrode, a projection of the second shielding electrode on the transparent substrate covers a gap between the projection of the eletrochromism layer of the second eletrochromism pixel and the projection of the data electrode on the transparent substrate.

Preferably, the data electrode and the gate of the thin film transistor are formed in the same layer.

Furthermore, the first shielding electrode and the gate of the thin film transistor are formed in the same layer.

Furthermore, the second shielding electrode and the drain of the thin film transistor are formed in the same layer.

An embodiment of the invention provides a eletrochromism display device, wherein a thin film transistor and a data electrode are provided in an opening region between two adjacent pixels, projections of the gate, source and drain of the thin film transistor and the data electrode at least partly cover the opening region, the gate, the source and the drain of the thin film transistor and the data electrode are made of opaque material, so that the light leaked from the opening region is shielded, and thus an effect of preventing the light-leakage from the opening region between two adjacent electrochomism pixels is realized, and finally the display effect of the electrochomism display device is improved.

To solve above problems, a method of fabricating an electrochomism display device in the invention adopts following solutions:

A method of fabricating an eletrochromism display device, comprising:

forming a plurality of eletrochromism pixels on a transparent substrate, wherein each of the electrochromism pixels comprises a first conductive layer, an eletrochromism layer, and a second conductive layer sequentially formed on the transparent substrate, and an opening region is provided between every two adjacent eletrochromism pixels;

forming a thin film transistor in the opening region, wherein a gate, a source and a drain of the thin film transistor are made of opaque material.

Furthermore, the fabricating method comprises:

forming a data electrode in the opening region, wherein the data electrode is made of opaque material, and projections of the gate, the source and the drain of the thin film transistor on the transparent substrate at least partly covers the opening region.

Furthermore, the opaque material is metal.

Furthermore, forming a thin film transistor in the opening region and forming a data electrode in the opening region comprise:

forming an active layer in the opening region;

forming the source and the drain in the opening region where the active layer is formed, wherein the drain is connected with a first conductive layer of a first eletrochromism pixel on one side of the opening region, a projection of the drain on the transparent substrate does not overlaps with a projection of the eletrochromism layer of the first eletrochromism pixel on the transparent substrate;

forming an insulation layer in the opening region wherein the source and the drain are formed;

forming the gate in the opening region wherein the insulation layer is formed, and forming the data electrode in the opening region comprises:

forming the data electrode in the opening region where the insulation is formed, wherein the data electrode on the transparent substrate is connected with a second conductive layer of a second electrochomism pixel on the other side of the opening region.

Furthermore, forming a thin film transistor in the opening region in the opening region comprises:

forming an active layer in the opening region;

forming the source and the drain in the opening region where the active layer is formed, wherein the drain is connected with a first conductive layer of a first eletrochromism pixel on one side of the opening region, a projection of the drain on the transparent substrate overlaps with a projection of the eletrochromism layer of the first eletrochromism pixel on the transparent substrate;

forming an insulation layer in the opening region where the source and the drain are formed;

forming the gate in the opening region where the insulation layer is formed, and forming the data electrode in the opening region comprises:

forming the data electrode and a first shielding electrode in the opening region where the insulation layer is formed, wherein a projection of the first shielding electrode on the transparent substrate covers a gap between the projection of the eletrochromism layer of the first eletrochromism pixel and the projection of the drain, and the data electrode is connected with a second conductive layer of a second eletrochromism pixel on the other side of the opening region.

Furthermore, forming a thin film transistor in the opening region and forming a data electrode in the opening region comprise:

forming the gate and the data electrode in the opening region, the data electrode is connected with a first conductive layer of a second eletrochromism pixel on one side of the opening region, the projection of the data electrode on the transparent substrate overlaps with a projection of the eletrochromism layer of the second eletrochromism pixel on the transparent substrate;

forming an insulation layer in the opening region where the gate and the data electrode are formed;

forming an active layer in the opening region where the insulation layer is formed; and forming the source and the drain in the opening region where the active layer is formed, wherein the drain of the thin film transistor is connected with a second conductive layer of a first eletrochromism pixel on the other side of the opening region.

Furthermore, forming a thin film transistor in the opening region and forming a data electrode in the opening region comprise:

forming the gate, the data electrode and a second shielding electrode in the opening region, the data electrode is connected with a first conductive layer of a second eletrochromism pixel on one side of the opening region, a projection of the data electrode on the transparent substrate does not overlaps with a projection of the electrochromism layer of the second eletrochromism pixel on the transparent substrate, the second shielding electrode is connected with the second conductive layer of a second eletrochromism pixel, a projection of the second shielding electrode on the transparent substrate covers a gap between the projection of the eletrochromism layer of the second eletrochromism pixel and the projection of the data electrode on the transparent substrate;

forming an insulation layer in the opening region where the gate, the data electrode and the second shielding electrode are formed;

forming an active layer in the opening region where the insulation is formed; and forming the source and the drain in the opening region where the active layer is formed, wherein the drain is connected with a second conductive layer of a first eletrochromism pixel on the other side of the opening region.

Preferably, the first shielding electrode and the gate of the thin film transistor are formed in the same layer.

Preferably, the second shielding electrode and the drain of the thin film transistor are formed in the same layer.

An embodiment of the invention provides a fabricating method of an eletrochromism display device, the method comprises forming a thin film transistor and a data electrode in an opening region, a gate, a source and a drain of the thin film transistor are made of opaque material, and projections of the gate, the source and the drain of the thin film transistor on the transparent substrate at least partly covers the opening region, so that the light leaked from the opening region is shielded, and thus an effect of preventing the light-leakage from the opening region between two adjacent electrochomism pixels is realized, and finally the effect of display of the electrochomism display device is improved.

BRIEF DESCRIPTION OF THE DRAWINGS

To clearly describe embodiments of the invention or solutions in the prior art, hereinafter, drawings used for describing the embodiments or the prior art will be briefly introduced, apparently, the following drawings are just some embodiments of the invention, the persons skilled in the art can obtain other drawings from these drawings without creative works.

FIG. 4a-FIG. 4f is an exploded diagram of another diagram illustrating the interlayer structure of the electrochomism display device of the embodiment in the invention, wherein FIG. 4f is another diagram illustrating the interlayer structure of the electrochomism display device of the embodiment in the invention;

FIG. 5a-FIG. 5e is an exploded diagram of still another diagram illustrating the interlayer structure of the electrochomism display device of the embodiment in the invention, wherein FIG. 5e is still another diagram illustrating the interlayer structure of the electrochomism display device of the embodiment in the invention;

DETAILED DESCRIPTION OF THE EMBODIMENTS

The embodiments of the invention provide an electrochomism display device which can effectively suppress the light-leakage phenomenon in the opening region between adjacent electrochomism pixels, thus the display effect of the electrochomism display device is improved.

In following description, in order to illustrate rather than limit, some specific details, such as a special system structure, an interface and techniques, are proposed so as to understand the invention thoroughly. However, persons skilled in the art should understand that the invention may also be realizes in other embodiments without these details. Among others, descriptions about well known devices, circuits and methods are omitted, so as to avoid unnecessary details to obscure the description of the present invention.

The First Embodiment

The embodiment provides an electrochomism display device, wherein the electrochomism display device comprises a plurality of electrochomism pixels, each of the eletrochromism pixels comprises a first conductive layer, an eletrochromism layer, and a second conductive layer sequentially formed on a transparent substrate; an opening region is provided between every two adjacent eletrochromism pixels. A thin film transistor provided in the opening region, and further preferably a data electrode may be provided in the opening region. A gate, a source and a drain of the thin film transistor and the data electrode are made of opaque material and projections of the gate, the drain and the source of the thin film transistor and the data electrode on the transparent substrate cover at least a part of the opening region.

Preferably, the opaque material is metal. The opaque material may also be doped semiconductor material, as long as a function of the drain can be realized and the material is opaque, but it is not limited thereto. In addition, a projection of a certain part referred in the description is a projection of the part on the transparent substrate.

Furthermore, in order to facilitate a person skilled in the art to understand the invention, hereinafter, the invention will be explained in detail in conjunction with specific embodiments and drawings.

Firstly, electrochomism display devices provided in embodiments of the invention may be classed into two categories depending on the type of the provided thin film transistor. One category refers to that a thin film transistor provided in an opening region between adjacent electrochomism pixels of the electrochomism display device is a top-gate thin film transistor; and the other category refers to that a thin film transistor provided in an opening region between two adjacent electrochomism pixels of the electrochomism display device is a bottom-gate thin film transistor.

Figure 1:
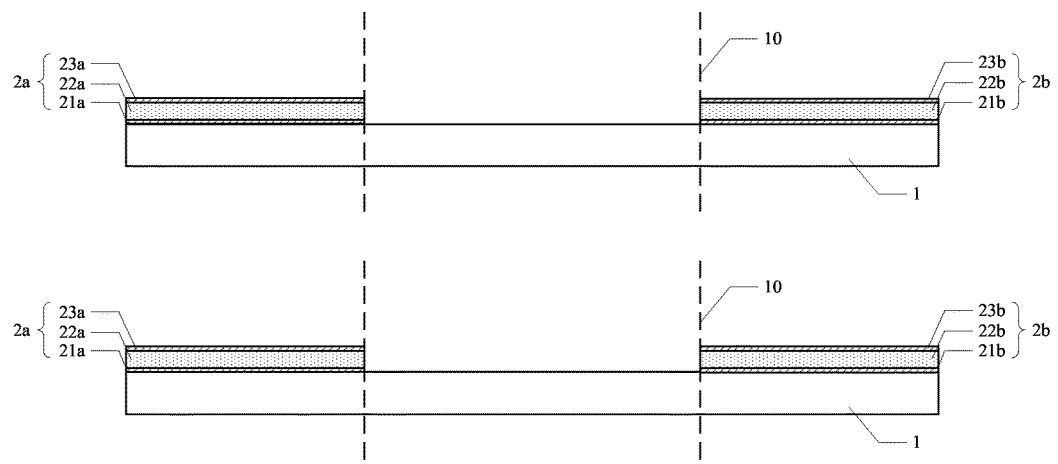
FIG. 1 is a diagram illustrating an interlayer structure of an electrochomism display device in the prior art.
Figure 2:
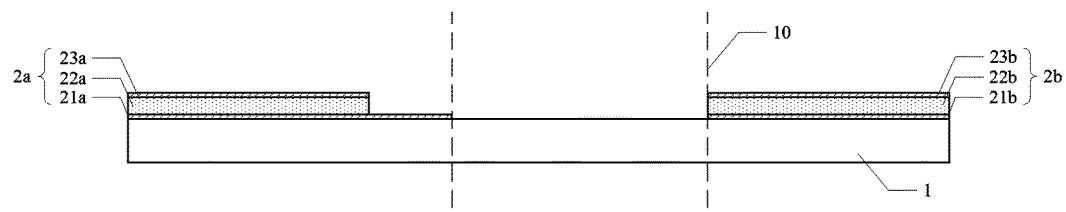
FIG. 2 is another diagram illustrating an interlayer structure of an electrochomism display device in the prior art.
Figure 3:
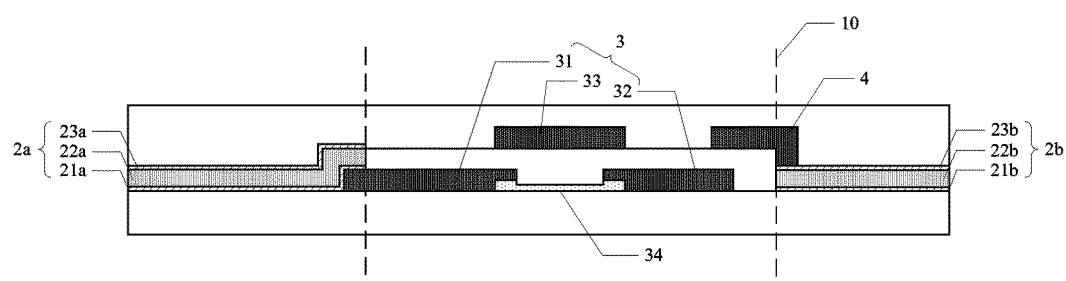
FIG. 3 is a diagram illustrating an interlayer structure of an electrochomism display device of an embodiment in the invention.
Figure 4A:
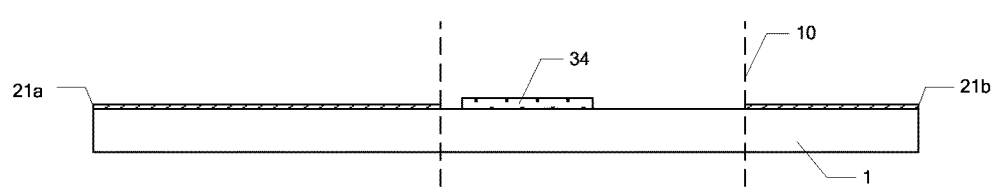
Figure 4B:
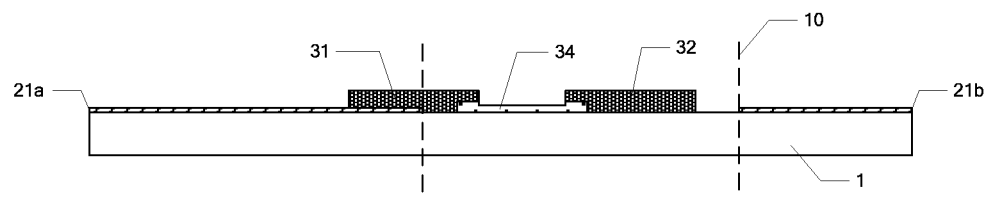
Figure 4C:
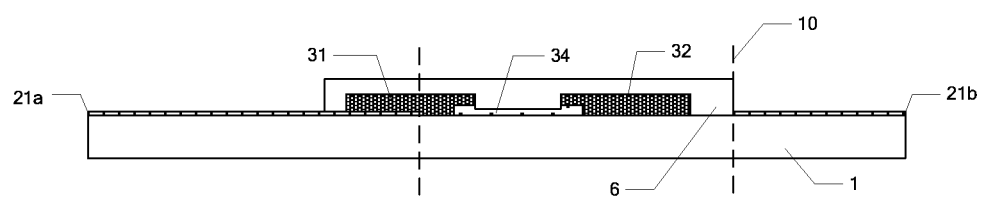
Figure 4D:
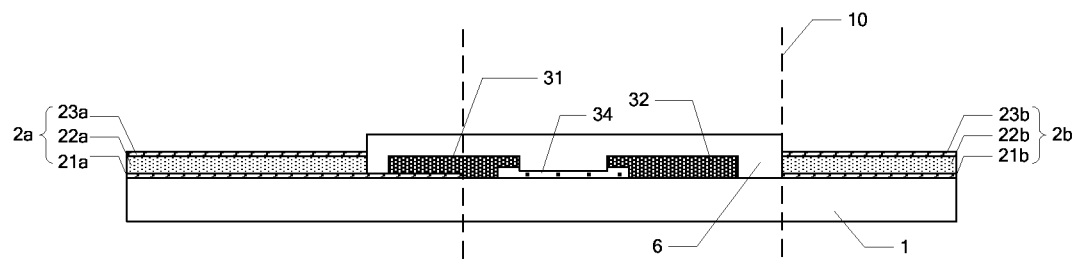
Figure 4E:
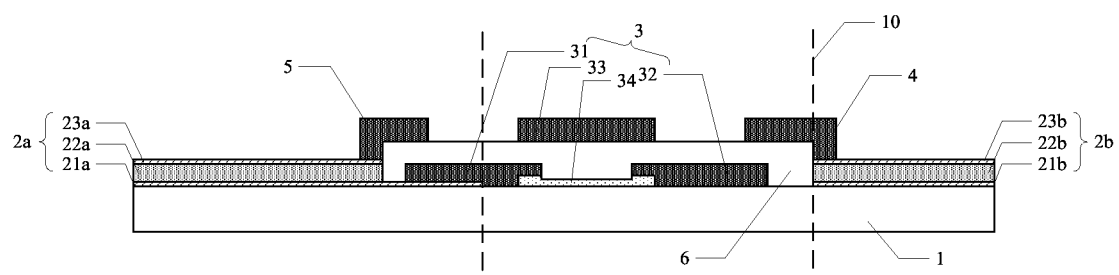
Figure 4F:
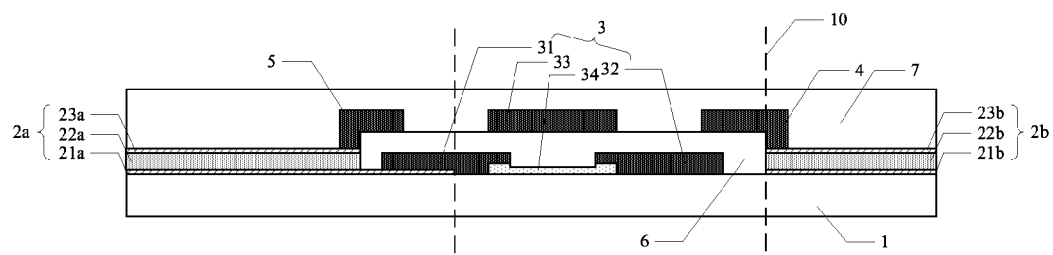

Specifically, FIG. 3 or FIG. 4 is a diagram illustrating an interlayer structure of an electrochomism display device of an embodiment in the invention, as shown in FIG. 3 or FIG. 4f, a thin film transistor provided in an opening region between two adjacent electrochomism pixels of the electrochomism display device is a top-gate thin film transistor.

Furthermore, as shown in FIG. 3, a top-gate thin film transistor 3 and a data electrode 4 is provided in the opening region between two adjacent electrochomism pixels of the electrochomism display device shown in FIG. 3. A drain 31 of the top-gate thin film transistor 3 is connected with a first conductive layer 21a of a first electrochomism pixel 2a, and the data electrode 4 is connected with a second conductive layer 23b of a second electrochomism pixel 2b.

At this time, in a case of projections of a gate 33, a source 32 and the drain 31 of the top-gate thin film transistor 3 and the data electrode 4 cover the opening region 10, and the gate 33, the source 32 and the drain 31 of the top-gate thin film transistor 3 and the data electrode 4 are made of opaque material, the light-leakage from the opening region 10 is shielded by above parts, and thus the light-leakage from the opening region is prevented.

In addition, in the electrochomism display device shown in FIG. 3, the projection of the drain 31 of the thin film transistor 3 overlaps with the projection of the electrochomism layer 22a of the first electrochomism pixel 2a, and a case wherein these projections do not overlap with each other will be described in detail in conjunction with the embodiment of the electrochomism display device shown in FIG. 4f.

In addition, it should be noted, through the structure shown in FIG. 3, a person skilled in the art will know that a first data signal may be inputted to the first conductive layer of the electrochomism pixel by using the gate of the top-gate thin film transistor 3 to control conduction of the source and the drain; and a second data signal may be inputted to the second conductive layer of the electrochomism pixel through the data electrode. Therefore, as to the electrochomism display device shown in FIG. 3, the top-gate thin film transistor 3 and the data electrode 4 provided in the opening region between adjacent electrochomism pixels may be used to input data signals to the electrochomism pixels in addition to shielding the light-leakage from the opening region, thus changes in color of electrochomism pixel may be controlled.

On the other hand, the embodiment also provides an electrochomism display device, the interlayer structure of which is shown in FIG. 4f. It should be noted, the structure of the electrochomism display device shown in FIG. 4f is different from that in FIG. 3 by a shielding electrode 5 which is provided in the opening region 10 between two adjacent electrochomism pixels of the electrochomism display device shown in FIG. 4f.

Specifically, in the electrochomism display device shown in FIG. 4f, the projection of the drain 31 of the thin film transistor 3 does not overlap with that of the electrochomism layer 22a of the first electrochomism pixel 2a. At this time, though the projections of the gate 33, the source 32 and the drain 31 of the top-gate thin film transistor 3 and the data electrode 4 cover the opening region 10, when the drain 31 of the top-gate thin film transistor 3 is connected with the first conductive layer 21a of the first electrochomism pixel 2a in a manner shown in FIG. 4, a gap is necessary between the drain 31 of the top-gate thin film transistor 3 and the first conductive layer 21a of the first electrochomism pixel 2a, in order to prevent a data output from the drain of the top-gate thin film transistor to directly act on the electrochomism layer to affect the changes in color of the electrochomism layer. That is to say, light is likely to be leaked from the gap between the drain 31 of the top-gate thin film transistor 3 and the electrochomism layer 22a of the first electrochomism pixel 2a.

As above, as a preferable embodiment, the second conductive layer 23a of the first electrochomism pixel 2a may also be provided with a shielding electrode 5 and connected thereto, a projection of the shielding electrode 5 covers the gap between the projection of the electrochomism layer 22a of the first electrochomism pixel 2a and the projection of the drain 31 of the top-gate thin film transistor 3, thus the light-leakage is prevented by using the shielding electrode 5 to shield the gap. It should be noted, the shielding electrode 5 is only used for shielding the gap and not for transmitting signals.

Preferably, the data electrode 4 and the gate 33 of the thin film transistor are formed in the same layer.

Preferably, the shielding electrode 5 and the gate 33 of the thin film transistor are formed in the same layer.

In summary, for the electrochomism display device comprising a thin film transistor which is a top-gate thin film transistor, the effect of preventing the light-leakage from the opening region between two adjacent electrochomism pixels and thus the display effect of the electrochomism display device are improved by providing the top-gate thin film transistor and the data electrode in the opening region between two adjacent electrochomism pixels and using the top-gate thin film transistor and the data electrode to shield the light leaked from the opening region. Meanwhile, the top-gate thin film transistor and the data electrode provided in the opening region between two adjacent electrochomism pixels may also be used to input data signal to the electrochomism pixel so as to control the change in color of the electrochomism pixel.

Figure 5A:
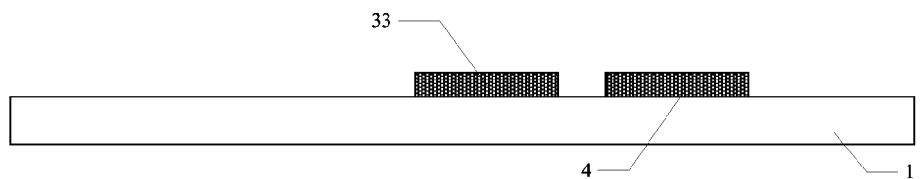
Figure 5B:
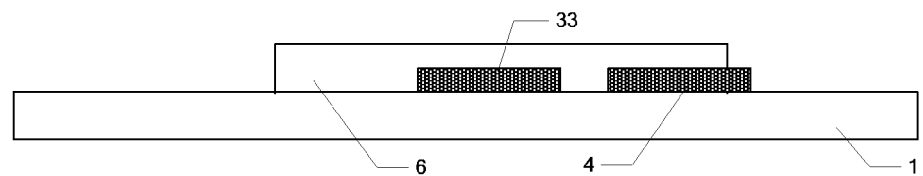
Figure 5C:
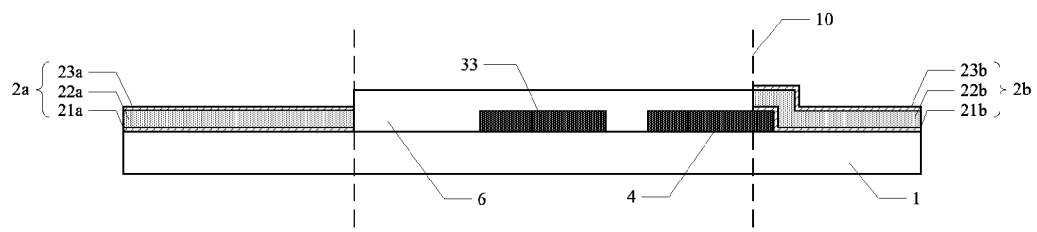
Figure 5D:
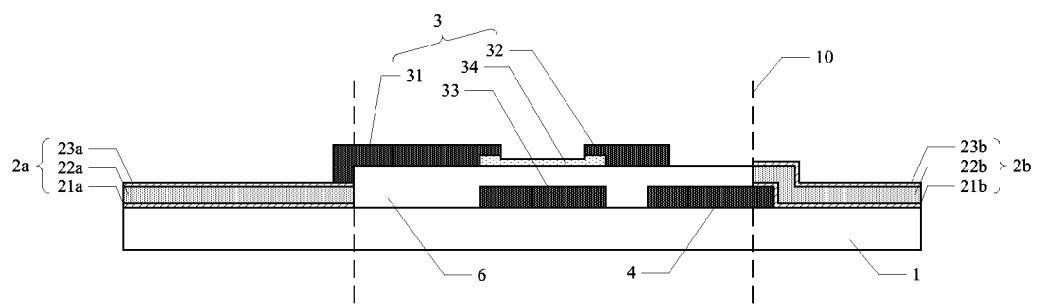
Figure 5E:
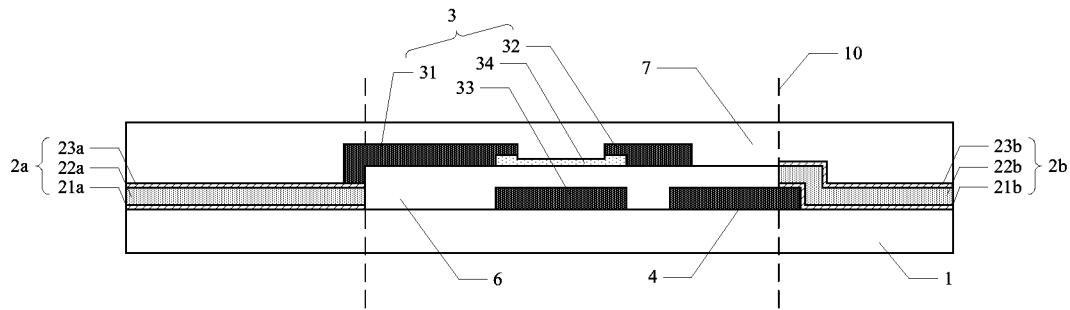
Figure 6:
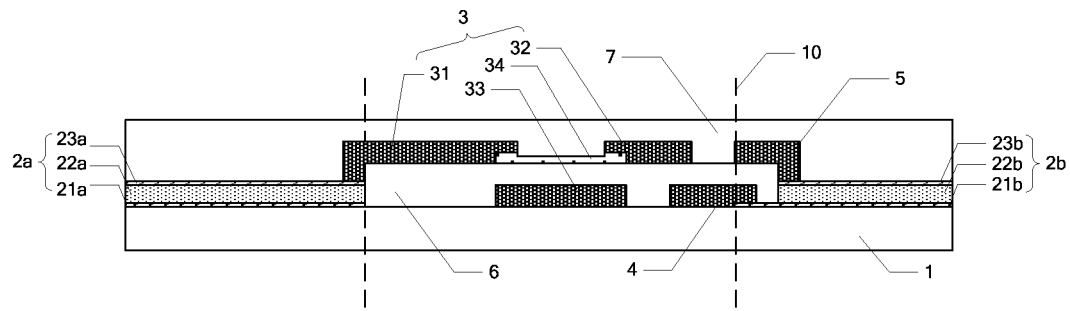
FIG. 6 is yet another diagram illustrating the interlayer structure of the electrochomism display device of the embodiment in the invention.

On the other hand, FIG. 5e or FIG. 6 is a diagram illustrating the interlayer structure of the electrochomism display device of the embodiment in the invention. As shown in FIG. 5e or FIG. 6, a thin film transistor provided in an opening region between two adjacent electrochomism pixels of the electrochomism display device is a bottom-gate thin film transistor.

Furthermore, as shown in FIG. 5e, in the electrochomism display device shown in FIG. 5e, a bottom-gate thin film transistor 3 and further preferably a data electrode 4 are provided in an opening region between two adjacent electrochomism pixels of the electrochomism display device. A drain 31 of the bottom-gate thin film transistor 3 is connected with the second conductive layer 23a of the first electrochomism pixel 2a, and the data electrode 4 is connected with the first conductive layer 21b of the second electrochomism pixel 2b.

As such, in a case of projections of a gate 33, a source 32 and the drain 31 of the bottom-gate thin film transistor 3 and the data electrode 4 cover the opening region 10, and the gate 33, the source 32 and the drain 31 of the top-gate thin film transistor 3 and the data electrode 4 are made of opaque material, the light-leakage from the opening region 10 is shielded by above parts, and thus the light-leakage from the opening region is prevented.

In the electrochomism display device shown in FIG. 5e, the projection of the data electrode 4 overlaps with the projection of the electrochomism layer 22b of the second electrochomism pixel 2b, and a case wherein these projections do not overlap with each other will be described in detail in conjunction with the embodiment of the electrochomism display device shown in FIG. 6.

In addition, it should be noted, through the structure shown in FIG. 5e, a person skilled in the art will know that a first data signal may be inputted to the second conductive layer of the electrochomism pixel by using the gate of the top-gate thin film transistor 3 to control conduction of the source and the drain; and a second data signal may be inputted to the first conductive layer of the electrochomism pixel through the data electrode. Therefore, as to the electrochomism display device shown in FIG. 5e, the top-gate thin film transistor 3 and the data electrode 4 provided in the opening region between adjacent electrochomism pixels may be used to input data signals to electrochomism pixel in addition to shielding the light-leakage from the opening region, thus changes in color of electrochomism pixel may be controlled.

On the other hand, the embodiment also provides an electrochomism display device, the interlayer structure of which is shown in FIG. 6. It should be noted, the structure of the electrochomism display device shown in FIG. 6 is different from that in FIG. 5e by a shielding electrode 5 which is provided in the opening region 10 between two adjacent electrochomism pixels of the electrochomism display device shown in FIG. 6.

Specifically, in the electrochomism display device shown in FIG. 6, the projection of the data electrode 4 does not overlap with that of the electrochomism layer 22b of the second electrochomism pixel 2b. At this time, though the projections of the gate 33, the source 32 and the drain 31 of the bottom-gate thin film transistor 3 and the data electrode 4 cover the opening region 10, when the data electrode 4 is connected with the first conductive layer 21b of the second electrochomism pixel 2b in a manner shown in FIG. 6, a gap between the data electrode 4 and the electrochomism layer 22b of the second electrochomism pixel 2b is necessary, in order to prevent a data output from the data electrode to directly acts on the electrochomism layer to affect the changes of color of the electrochomism layer. Therefore, light is likely to be leaked from the gap between the data electrode 4 and the electrochomism layer 22b of the second electrochomism pixel 2b.

As a preferable embodiment, the second conductive layer 23b of the second electrochomism pixel 2b may also be provide with a shielding electrode 5 and connected therewith, a projection of which covers the gap between the projection of the electrochomism layer 22b of the second electrochomism pixel 2b and the projection of the data electrode 4, thus the light-leakage is prevented by using the shielding electrode 5 to shield the gap. As such, the shielding electrode 5 is only used for shielding the gap and not for transmitting signals.

Preferably, the data electrode 4 and the gate 33 of the thin film transistor 3 are formed in the same layer.

Preferably, the shielding electrode 5 and the drain 31 of the thin film transistor 3 are formed in the same layer.

In summary, for the electrochomism display device comprising a thin film transistor which is a bottom-gate thin film transistor, the effect of preventing the light-leakage from the opening region between two adjacent electrochomism pixels and thus the display effect of the electrochomism display device is improved by providing the bottom-gate thin film transistor and the data electrode in the opening region between two adjacent electrochomism pixels and using the bottom-gate thin film transistor and the data electrode to shield the light leaked from the opening region. Meanwhile, the bottom-gate thin film transistor and the data electrode provided in the opening region between two adjacent electrochomism pixels may also be used to input data signals to electrochomism pixel so as to control the change in color of electrochomism pixel.

The Second Embodiment

This embodiment provides a method of fabricating an electrochomism display device for forming above electrochomism display device.

Figure 7:
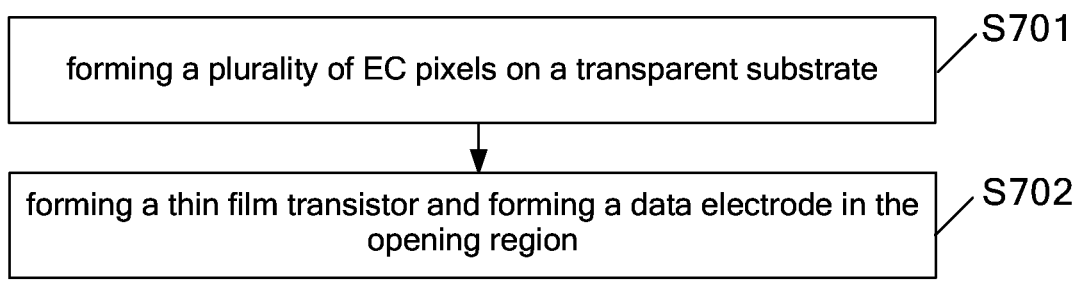
FIG. 7 is a flowchart of fabricating the electrochomism display device of the embodiment in the invention.

As shown in FIG. 7, the method comprises:

Step S701, forming a plurality of electrochomism pixels on a transparent substrate.

Wherein, each of the eletrochromism pixels comprises a first conductive layer, an eletrochromism layer, and a second conductive layer sequentially formed on a transparent substrate 1, and an opening region 10 is provided between every two adjacent eletrochromism pixels.

Step S702, forming a thin film transistor and forming a data electrode in the opening region.

Wherein, the gate 33, the source 32 and the drain 31 of the thin film transistor 3 and the data electrode 4 are made of opaque material, and projections of the gate 33, the source 32 and the drain 31 of the thin film transistor 3 and the data electrode 4 at least partly cover the opening region 10.

Further, the opaque material is metal. The opaque material may also be doped semiconductor material, as long as a function of the drain can be realized and the material is opaque, but it is not limited thereto.

The embodiment provides a method of fabricating an electrochomism display device, which comprises forming a thin film transistor and further preferably forming a data electrode in the opening region, the gate, the source and the drain of the thin film transistor and the data electrode are made of opaque material, and projections of the gate, the source and the drain of the thin film transistor and the data electrode at least partly cover the opening region, so that the light leaked from the opening region is shielded, and thus an effect of preventing the light-leakage from the opening region between two adjacent electrochomism pixels is realized, and finally the display effect of the electrochomism display device is improved.

It can be known from the first embodiment, the electrochomism display devices may be classed into two categories depending on the type of the provided transistor. One category refers to that a thin film transistor provided in an opening region between adjacent electrochomism pixels of the electrochomism display device is a top-gate thin film transistor; and the other category refers to that a thin film transistor provided in an opening region between two adjacent electrochomism pixels of the electrochomism display device is a bottom-gate thin film transistor. Accordingly, methods for fabricating the electrochomism display devices of different categories are different.

Figure 8:
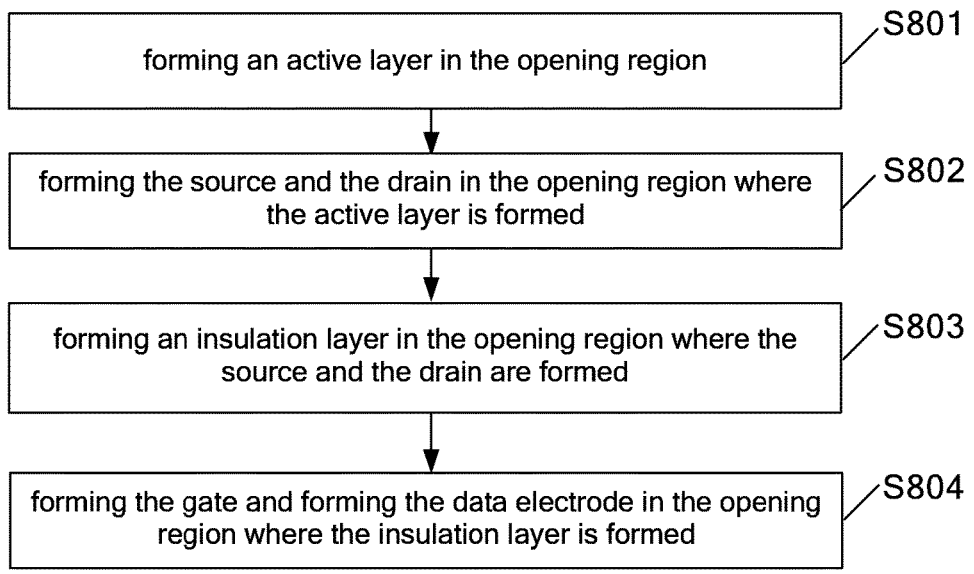
FIG. 8 is a flowchart of fabricating a part of the electrochomism display device in FIG. 3.

Specifically, for the electrochomism display device shown in FIG. 3, the step S702 in the method shown in FIG. 7 comprises following steps shown in FIG. 8:

Step S801, forming an active layer in the opening region.

Forming a semiconductor layer on the transparent substrate 1 in the opening region, and forming a pattern of the active layer 34 by using a single patterning process including masking, exposing, etching and removing the photoresist.

Step S802, forming the source and the drain in the opening region where the active layer is formed.

Wherein, the drain 31 is connected with the first conductive layer 21a of the first electrochomism pixel 2a, and the projection of the drain 31 overlaps with that of the electrochomism layer 22a of the first electrochomism pixel 2a.

Specifically, forming a source-drain metal layer on the transparent substrate after the step S801, and forming a pattern of the source 32 and the drain 31 of a top-gate transistor by using a single patterning process including masking, exposing, etching and removing the photoresist; meanwhile, forming a pattern of channel of the top-gate transistor.

Step S803, forming an insulation layer in the opening region where the source and the drain are formed.

Specifically, forming an insulation layer on the transparent substrate after the step S803, and forming a pattern 6 of the insulation layer by using a single patterning process including masking, exposing, etching and removing the photoresist. The insulation layer 6 is used to cover the pattern of the source 32 and the drain 31 of the top-gate transistor and the pattern of the active layer 34a.

Step S804, forming the gate and forming the data electrode in the opening region where the insulation layer is formed.

Wherein, the data electrode 4 is connected with the second conductive layer 23b of the second electrochomism pixel 2b.

Specifically, forming a gate metal layer on the transparent substrate after the step S803, and forming a pattern of the data electrode 4 and the gate 33 of a top-gate transistor 3 by using a single patterning process including masking, exposing, etching and removing the photoresist.

Preferably, the data electrode 4 and the gate 33 of the thin film transistor 3 are formed in the same layer.

It should be noted, in addition to above steps, the method of fabricating the electrochomism display device shown in FIG. 3 further comprises a step of forming the first conductive layer, the electrochomism layer, and the second conductive layer, which will be obtained by persons skilled in the art without creative efforts, and detail description thereof will be omitted in the embodiment.

Figure 9:
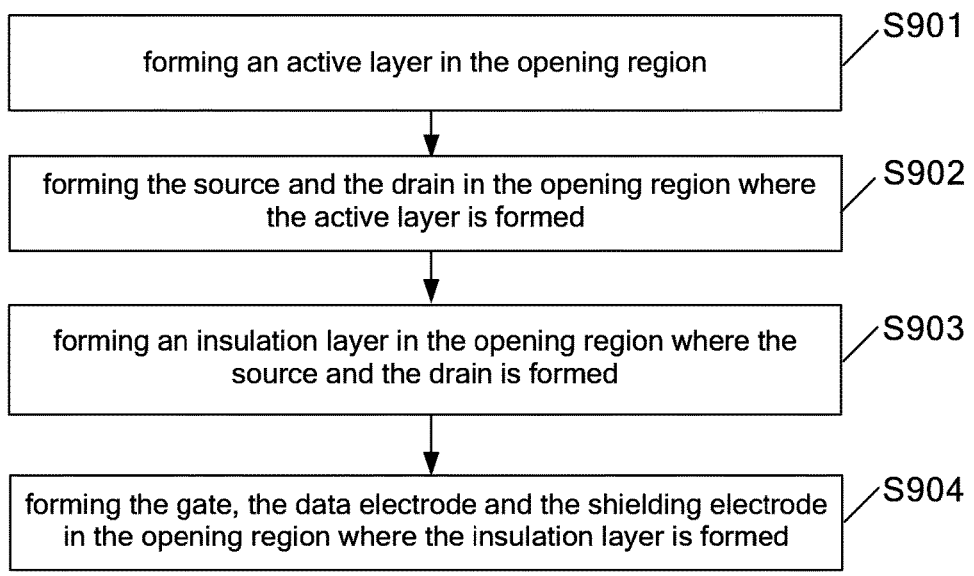
FIG. 9 is a flowchart of fabricating a part of the electrochomism display device in FIG. 4f.

Similarly, for the electrochomism display device shown in FIG. 4*f*, the step S702 in the method shown in FIG. 7 comprises following steps shown in FIG. 9:

Step S901, forming an active layer in the opening region.

Step S902, forming the source and the drain in the opening region where the active layer is formed.

Wherein, the drain 31 is connected with the first conductive layer 21*a* of the first electrochomism pixel 2*a*, and the projection of the drain 31 overlaps with that of the electrochomism layer 22*a* of the first electrochomism pixel 2*a*.

Step S903, forming an insulation layer in the opening region where the source and the drain are formed.

Step S904, forming the gate, the data electrode and the shielding electrode in the opening region where the insulation layer is formed.

Wherein, the projection of the shielding electrode 5 covers the gap between the projection of the electrochomism layer 22*a* of the first electrochomism pixel 2*a* and the projection of the drain 31, and the data electrode 4 is connected with the second conductive layer 23*b* of the second electrochomism pixel 2*b* adjacent to the first electrochomism pixel 2*a*.

Preferably, the data electrode 4 and the gate 33 of the thin film transistor 3 are formed in the same layer.

Preferably, the shielding electrode 5 and the gate 33 of the thin film transistor are formed in the same layer. It should be noted, above description just relates to steps included in the step S702 of the method of fabricating the electrochomism display device shown in FIG. 4*f*, the fabrication of the electrochomism display device shown in FIG. 4*f* also need other fabricating steps. In the whole fabricating procedure, interlayer structures after various steps are shown in FIGS. 4*a*-4*f*, the specific fabricating procedure can be obtained by persons skilled in the art based on the embodiments of the invention without creative efforts, which will not be described in the embodiments of the invention.

Figure 10:
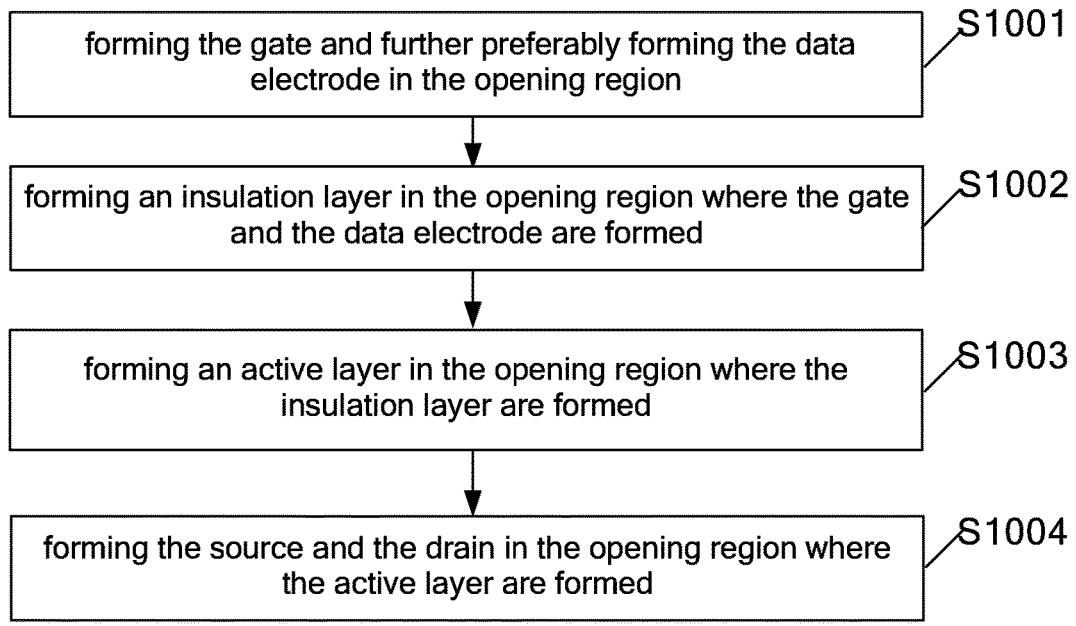
FIG. 10 is a flowchart of fabricating a part of the electrochomism display device in FIG. 5e.

Similarly, for the electrochomism display device shown in FIG. 5*e*, the step S702 in the method shown in FIG. 7 comprises following steps shown in FIG. 10:

Step S1001, forming the gate and further preferably forming the data electrode in the opening region.

Wherein, the data electrode 4 is connected with the first conductive layer 21*b* of the second electrochomism pixel 2*b*, and the projection of the data electrode 4 overlaps with that of the electrochomism layer 22*b* of the second electrochomism pixel 2*b*.

Step S1002, forming an insulation layer in the opening region where the gate and the data electrode are formed.

Step S1003, forming an active layer in the opening region where the insulation layer is formed.

Step S1004, forming the source and the drain in the opening region where the active layer is formed.

Wherein, the drain 31 is connected with the second conductive layer 23*a* of the first electrochomism pixel 2*a*.

It also should be noted, above description just relates to steps included in the step S702 of the method of fabricating the electrochomism display device shown in FIG. 5*e*, the fabrication of the electrochomism display device shown in FIG. 5*e* also need other fabricating steps. In the whole fabricating procedure, interlayer structures after various steps are shown in FIGS. 5*a*-5*e*, the specific fabricating procedure can be obtained by a person skilled in the art based on the embodiments of the invention without creative efforts, which will not be described in the embodiments of the invention.

Figure 11:
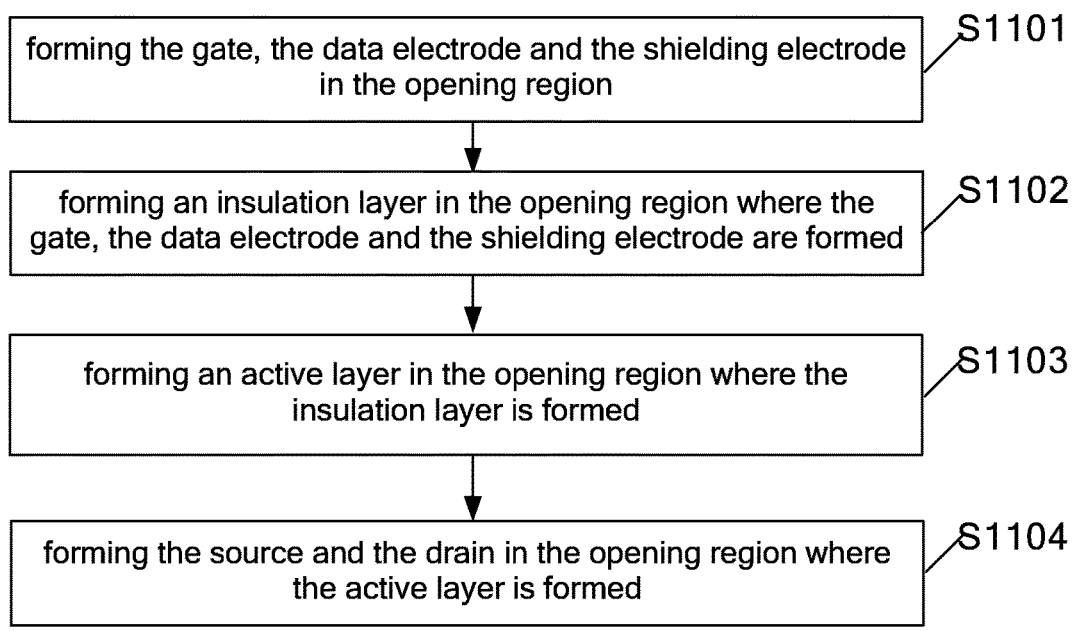
FIG. 11 is a flowchart of fabricating a part of the electrochomism display device in FIG. 6.

Similarly, for the electrochomism display device shown in FIG. 6, the step S702 in the method shown in FIG. 7 comprises following steps shown in FIG. 11:

Step S1001, forming the gate, the data electrode and the shielding electrode in the opening region.

Wherein, the data electrode 4 is connected with the first conductive layer 21*b* of the second electrochomism pixel 2*b*, the projection of the data electrode 4 does not overlap with the projection of the electrochomism layer 22*b* of the second electrochomism pixel 2*b*, the shielding electrode 5 is connected with the second conductive layer 23*b* of the second electrochomism pixel 2*b*, the projection of the shielding electrode 5 covers the gap between the projection of the electrochomism layer 22*b* of the second electrochomism pixel 2*b* and the projection of the data electrode 4.

Preferably, the shielding electrode 5 and the drain 31 of the thin film transistor 3 are formed in the same layer.

Step S1102, forming an insulation layer in the opening region where the gate, the data electrode and the shielding electrode are formed.

Step S1103, forming an active layer in the opening region where the insulation layer is formed.

Step S1104, forming the source and the drain in the opening region where the active layer is formed.

Wherein, the drain 31 is connected with the second conductive layer 23*a* of the first electrochomism pixel 2*a*.

It should be noted, the method of fabricating the electrochomism display device shown in FIG. 6 comprises above steps, but the method should further comprise steps of forming structures such as the first conductive layer, the electrochomism layer and the second conductive, which can be obtained by a person skilled in the art based on the invention without creative efforts, which will not be described in the embodiments of the invention.

The description above only illustrates specific implementation manners of the present invention. However, the protection scope of the present invention is not limited thereto. Any changes or alternations that may be easily made by a person skilled in the art without departing from the technical scope disclosed in the present invention should be included within the protection scope of the present invention. Hence, the protection scope of the present invention should be subject to that defined by the appended claims.

The invention claimed is:

1. An electrochromism display device comprising a plurality of electrochromism pixels, each of the electrochromism pixels comprises a first conductive layer, an electrochromism layer, and a second conductive layer sequentially formed on a transparent substrate, an opening region is provided between every two adjacent electrochromism pixels, wherein
   a thin film transistor is provided in the opening region, and a gate, a source and a drain of the thin film transistor are made of opaque material,
   the thin film transistor is configured to shield light leaked from the opening region, and
   a data electrode made of opaque material is provided in the opening region, and projections of the gate, the drain and the source of the thin film transistor and the data electrode at least partly covers the opening region, wherein a first data signal is inputted to the first conductive layer of an electrochromism pixel by using the gate of the thin film transistor to control conduction of the source and the drain; and a second data signal is inputted to the second conductive layer of an adjacent electrochromism pixel through the data electrode;

wherein the opaque material is metal;

wherein the thin film transistor is a top-gate thin film transistor, the drain of the thin film transistor is directly connected with a first conductive layer of a first electrochromism pixel on one side of the opening region, the projection of the drain of the thin film transistor on the transparent substrate does not overlap with a projection of the electrochromism layer of the first electrochromism pixel on the transparent substrate;

a first shielding electrode is provided in the opening region, a projection of the first shielding electrode on the transparent substrate covers a gap between the projection of the electrochromism layer of the first electrochromism pixel on the transparent substrate and the projection of the drain of the thin film transistor on the transparent substrate; and the data electrode is directly connected with a second conductive layer of a second electrochromism pixel on the other side of the opening region; and wherein the data electrode and the gate of the thin film transistor are formed in the same layer.

2. The electrochromism display device of claim 1, wherein the first shielding electrode and the gate of the thin film transistor are formed in the same layer.

* * * * *